United States Patent
Knoll et al.

(10) Patent No.: US 6,233,200 B1
(45) Date of Patent: May 15, 2001

(54) METHOD AND APPARATUS FOR SELECTIVELY DISABLING CLOCK DISTRIBUTION

(75) Inventors: Ernest Knoll, Haifa; Eyal Fayneh, Givataym, both of (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/465,220

(22) Filed: Dec. 15, 1999

(51) Int. Cl.$^7$ ........................................ G11C 8/00
(52) U.S. Cl. .................. 365/233; 365/195; 365/189.05
(58) Field of Search ................................. 365/233, 195, 365/189.05

(56) References Cited

U.S. PATENT DOCUMENTS 5,886,582 * 3/1999 Stansell ........................ 331/1 A

* cited by examiner

Primary Examiner—Huan Hoang
(74) Attorney, Agent, or Firm—Fish & Richardson P.C.

(57) ABSTRACT

A clock distribution network includes a phase-locked loop (PLL), clock buffers, an enabling circuit, and a distribution inhibit circuit. The PLL is configured to generate a clock signal and a lock detect signal. The clock buffers are adapted to receive the clock signal from the PLL. The buffers have outputs that can be connected to clock loads. The enabling circuit enables selected buffers to drive the clock loads. The distribution inhibit circuit selectively produces the enable signal to inhibit distribution of the clock signal responsive to the lock detect signal.

11 Claims, 5 Drawing Sheets

METHOD AND APPARATUS FOR SELECTIVELY DISABLING CLOCK DISTRIBUTION

BACKGROUND

This disclosure relates to a clock distribution network system.

A clock distribution network system distributes a precise clock generated by a phase-locked loop (PLL) to different units on a chip. The PLL cannot directly drive the clock load because it is often heavily loaded. For example, a typical clock load on a chip is about 300 pico-Farads.

The clock distribution network system includes sets of buffers, gates, and wire-lines that distribute the clock to the various units on a chip. The system provides optimal routing of the clock chosen to provide accurate timing. The system also provides efficient power management by enabling clock delivery to active units and disabling delivery to inactive units.

A PLL takes advantage of a negative feedback to constantly adjust the frequency and phase of an oscillator that may change or drift. FIG. 1 is a simplified block diagram of a conventional PLL. The PLL includes a phase and frequency detector 100, a loop filter (low pass) 101, a voltage-controlled oscillator (VCO) 102, and a feedback frequency divider 103.

The phase and frequency detector 100 takes two signals as its inputs and outputs a voltage proportional to the difference between the frequencies of the two input signals.

The VCO 102 operates in reverse. It takes a voltage as its control input and outputs a signal having a frequency based on the value of the input voltage. Thus, during a PLL acquisition process, the VCO 102 is often sweeping through a wide range of frequencies. For example, the acquisition process may take less than 1 $\mu$S; during this period, the VCO output frequency sweeps through a range from a PLL steady state frequency of few hundred MHz to a very high frequency of several GHz.

SUMMARY

An apparatus comprising a distribution inhibit circuit is disclosed. The circuit selectively inhibits distribution of a clock signal responsive to a lock detect signal being de-asserted.

BRIEF DESCRIPTION OF THE DRAWINGS

Different aspects of the disclosure will be described in reference to the accompanying drawings wherein.

DETAILED DESCRIPTION

During the acquisition process, which may be less than 1 $\mu$S, the VCO output signal continues to drive the clock distribution network system. As a result, the system consumes a large amount of current at the VCO rate. This leads to high fast-current transient amplitude and high current-derivative (dI/dt) noise because the network is heavily loaded. The high current-derivative noise can cause electro-magnetic interference (EMI) and RF interference (RFI) in a system.

Figure 1:
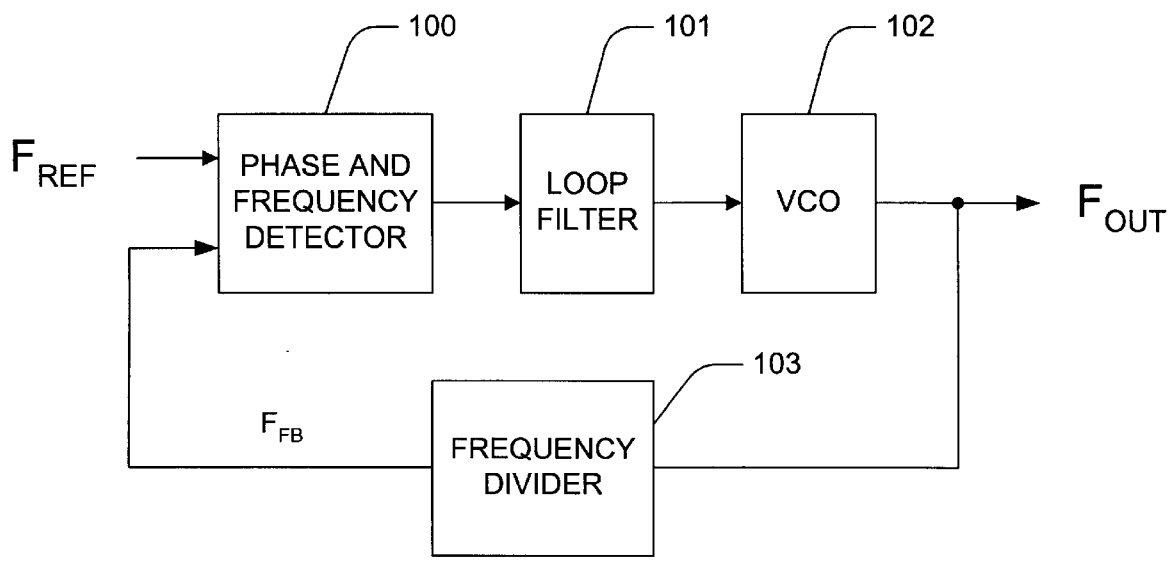
FIG. 1 is a simplified block diagram of the PLL.
Figure 2:
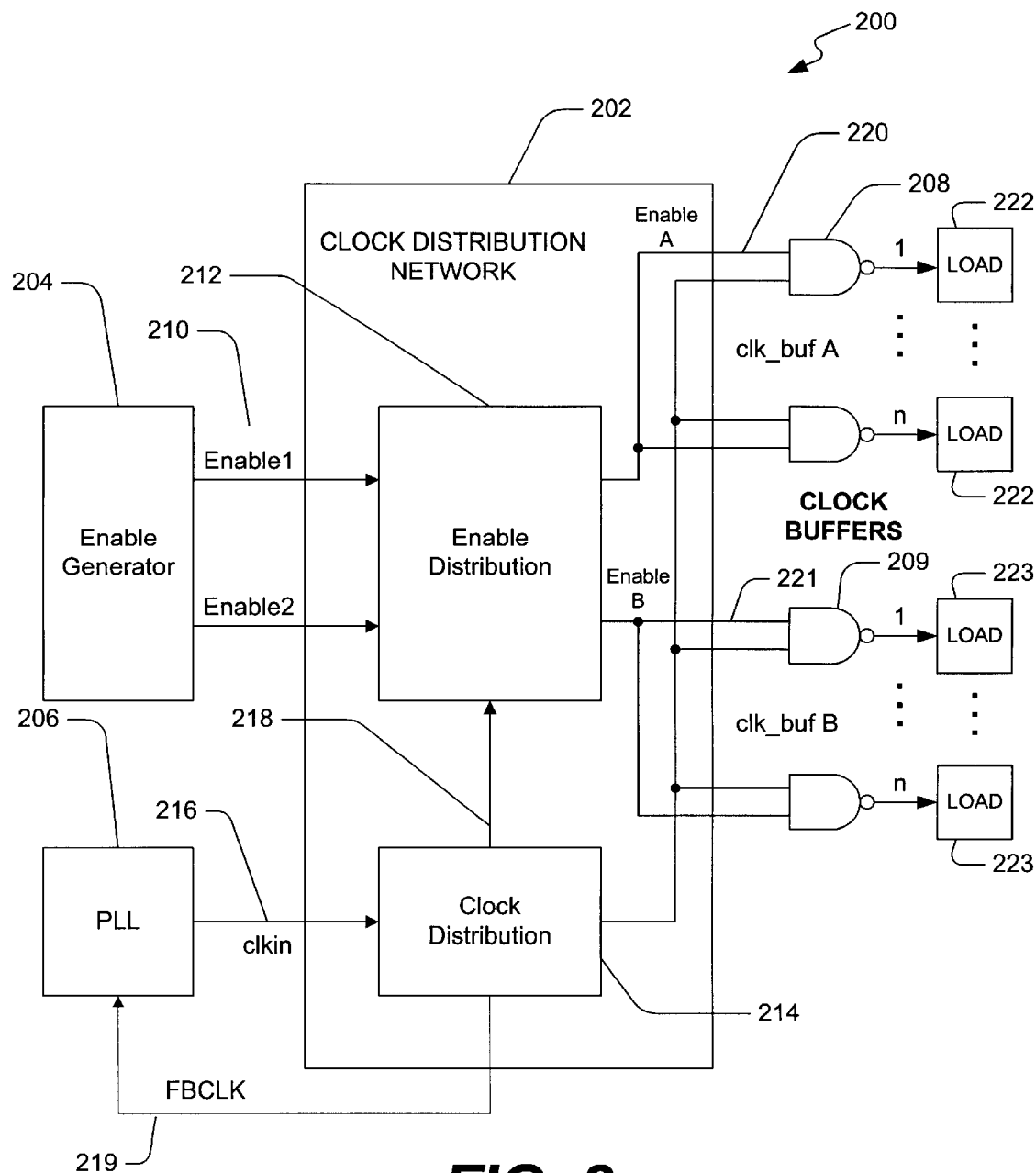
FIG. 2 is a block diagram of a conventional clock distribution network system.

FIG. 2 is a block diagram of a conventional clock distribution network system 200. The system 200 includes a clock distribution network 202, an enable generator 204, a phase-locked loop (PLL) 206, and clock buffers 208, 209.

The clock distribution network 202 includes an enable distribution circuit 212 and a clock distribution circuit 214. The clock distribution circuit 214 receives the PLL clock 216 and routes the clock to the clock buffers 208, 209. The circuit 214 also includes the distribution of the feedback clock (FBCLK) 219 to the PLL. The circuit 214 generates an early version of the clock 218 that samples enable signals 210. This early clock 218 synchronizes the PLL clock 216 and the enable signals 210 to arrive at the clock buffers 208, 209 at a proper time.

Each clock buffer 208, 209 delivers the PLL clock signal 216 to the clock loads 222, 223 when a corresponding trigger-enable signal 220, 221 is asserted. For example, the clock loads 222 tied to the clock buffer A, gates 208, receive the PLL clock 216 when the trigger-enable A signal 220 is asserted by the enable distribution circuit 212.

The clock enable generator 204 monitors active status of the units within a chip or board. The enable generator 204 then generates signals 210 to enable the clock to active units and disable the clock to inactive units. The monitoring function of the enable generator 204 allows it to manage power by disabling clock deliveries to units that are inactive or idle.

However, the enable generator 204 fails to provide a mechanism for disabling the clock delivery during the fast PLL acquisition process. In the conventional system 200, the VCO output signal continues to drive the clock distribution network during this acquisition process. The system consumes a relatively large amount of current from a power distribution network at the VCO rate. This leads to high transient current amplitude and high current-derivative (dI/dt) noise that causes electro-magnetic interference (EMI) and RF interference (RFI).

Figure 3:
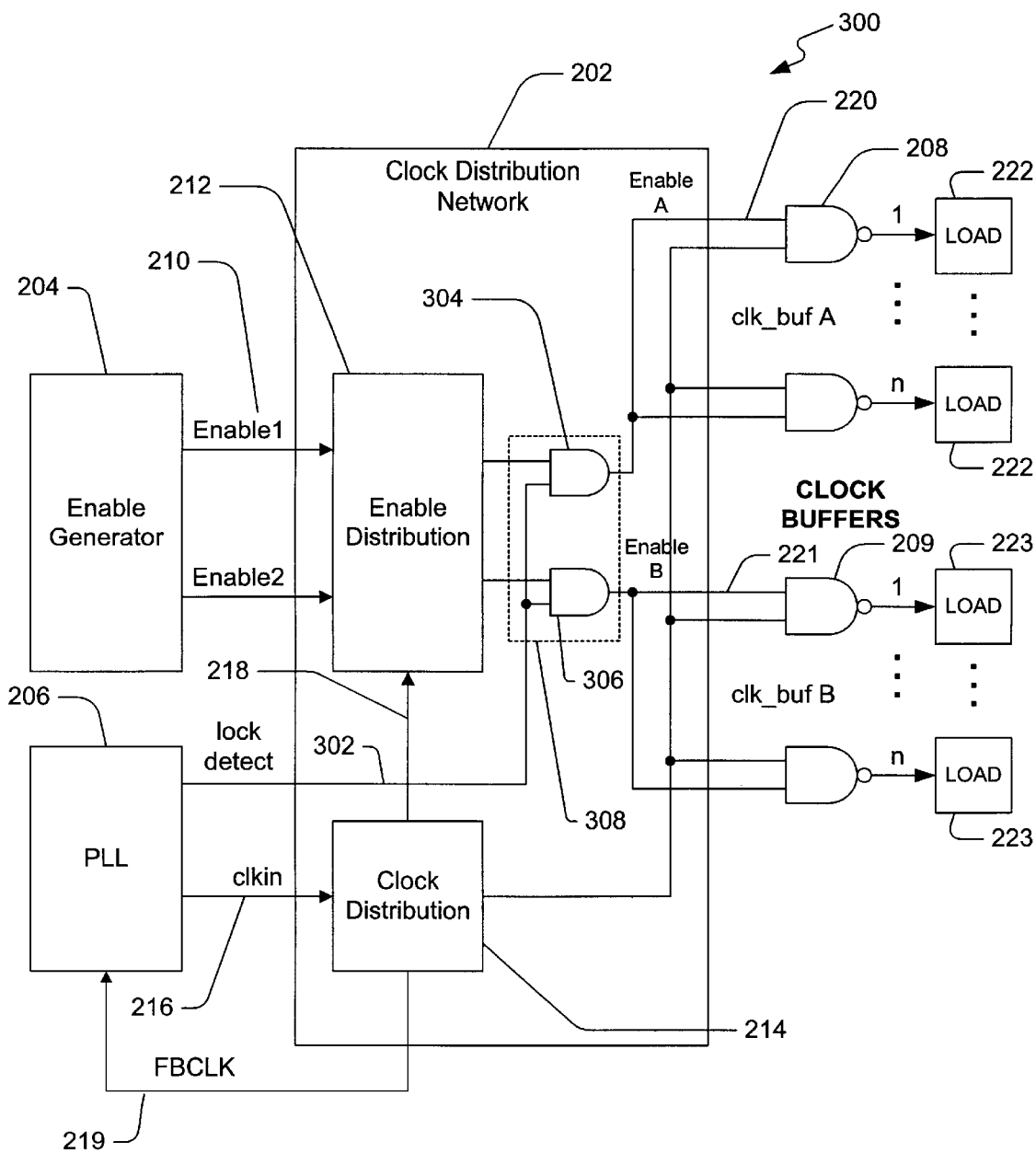
FIG. 3 is a block diagram of a modified clock distribution network system.

A clock distribution network system 300 for one embodiment, shown in FIG. 3, addresses the above-described inefficiencies. The new design further includes a mechanism to disable the clock distribution during this PLL acquisition process. The new design enables efficient power management by turning off the PLL clock distribution during high frequency excursions of the clock. It also allows the clock distribution network system 300 to provide an accurate clock with less EMI and RFI.

The network system 300 further includes a PLL clock inhibit-during-lock circuit 308. The circuit 308 receives a PLL lock indication signal 302 from the PLL. This signal 302 may be implemented in a conventional PLL but is often used only for testing purposes. The PLL lock indication signal 302 stays at logic low during the PLL acquisition process. A logic low at the input of AND gates 304, 306 inhibits enable signals 210 from being distributed to the clock buffers 208, 209. For example, the AND gate 304 inhibits the trigger-enable A signal 220 from being passed on to a clock buffer A 208. The AND gate 306 inhibits B signal 221 from being passed on to a clock buffer B 209.

Once the PLL acquisition process completes, the PLL lock indication signal 302 transitions to logic high. The AND gates 304, 306 pass the enable signals 210 through to the clock buffers 208, 209. Therefore, if the PLL is not locked (i.e. lock indication signal is not asserted), the lock indication signal 302 forces the clock buffers 208, 209 to inhibit clock distribution, even if the enable signals 210 are asserted. In an alternative embodiment, the AND gates can be replaced with NAND gates and inverters for efficiency purpose.

Figure 4:
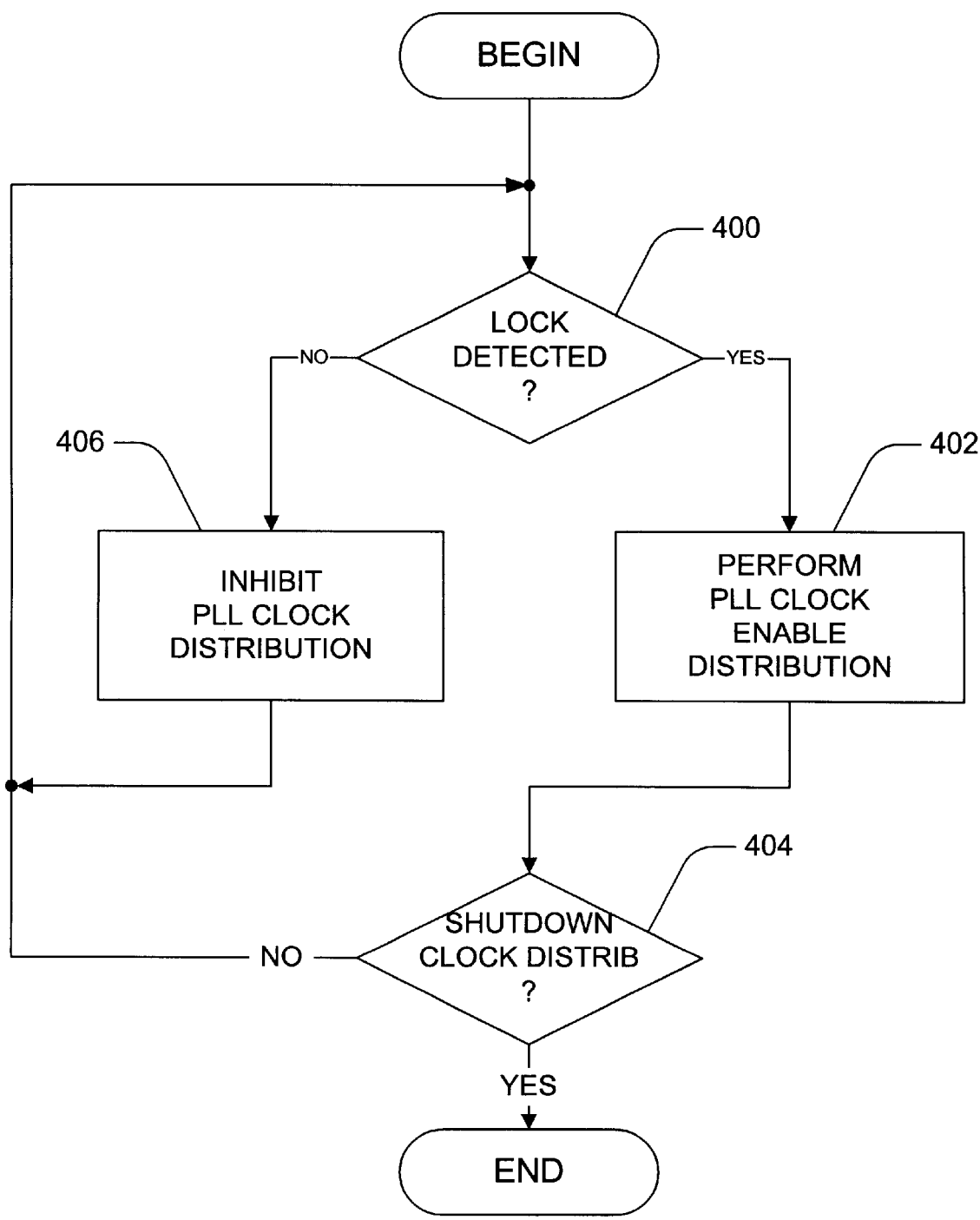
FIG. 4 is a flow diagram for a PLL clock inhibit-during-lock process.

FIG. 4 is a flow diagram for the PLL clock inhibit-during-lock process according to an embodiment of the present invention. The PLL lock indication signal 302 is polled, at 400, to determine if the lock has been achieved. If the lock is detected, the process in the clock distribution network 202 performs the PLL clock enable distribution, at 402. The process then checks power signals, at 404, to determine if a shutdown of the clock distribution system is requested. If the request is not made, the process continues to the next cycle, at 400. When the lock is not detected, the process inhibits the PLL clock distribution, at 406.

Figure 5:
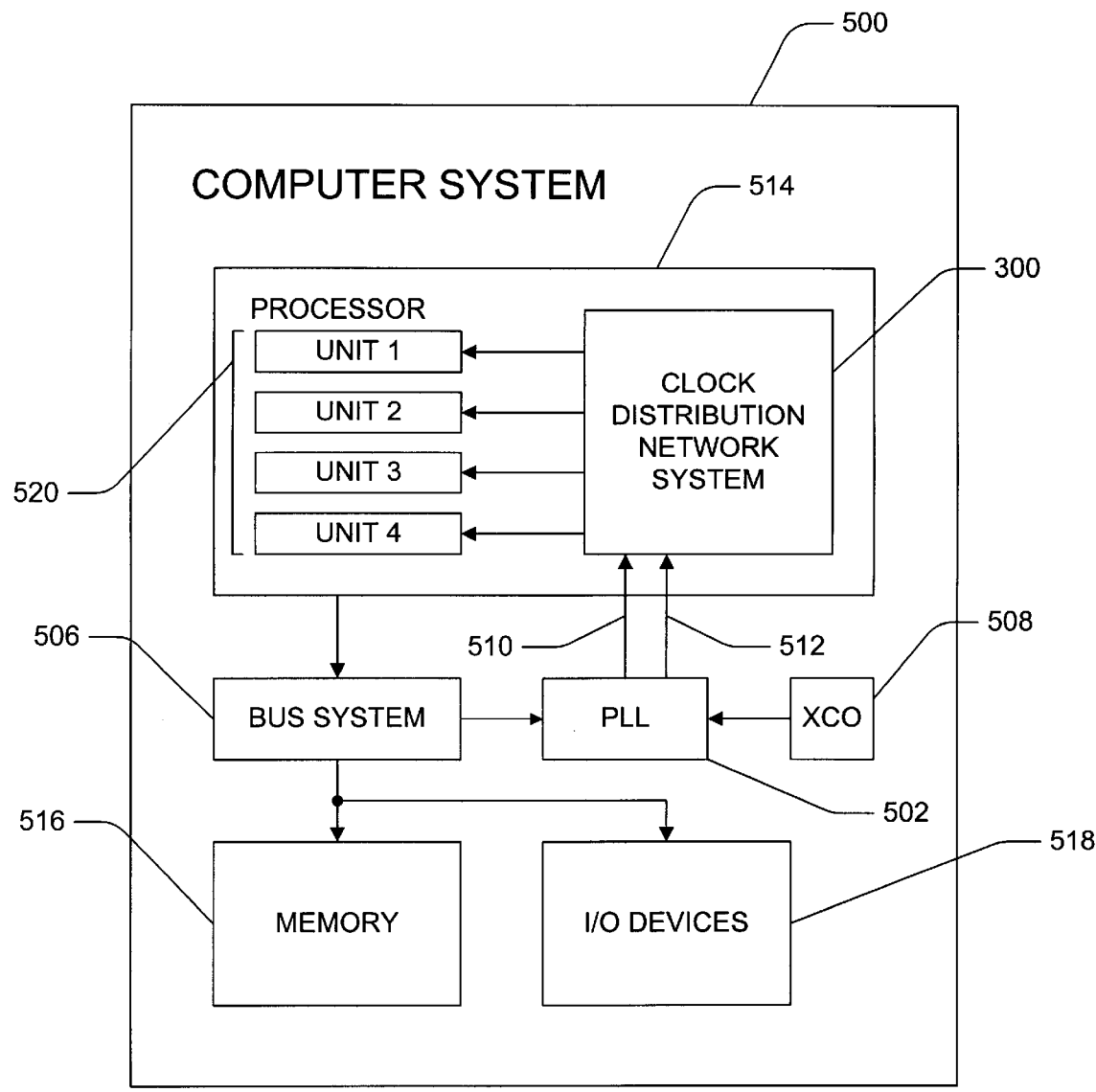
FIG. 5 is a block diagram of a computer system having a clock distribution network system.

FIG. 5 is a block diagram of a computer system 500. In one embodiment, the computer system 500 includes a PLL 502 and a clock distribution network system 300.

The PLL 502 receives a bus clock 704 from a bus system 506. A phase detector in the PLL 502 compares the bus clock signal 504 with a feedback frequency from the VCO. The feedback frequency locks the output of the VCO to the multiple frequency of the bus clock 504. The VCO often employs a crystal oscillator 508 for the reference due to its low phase noise as well as its high accuracy, which insures good frequency matching.

The clock distribution network system 300 receives the PLL clock 510 and the lock indication signal 512 from the PLL 502. The network system 300 processes the lock indication signal 512 to determine whether to disable or enable the PLL clock 510. If the lock indication signal 512 is asserted, the network system 300 distributes the PLL clock 510 to various units 520 in the processor 514.

The processor 514 is then able to interface with other components of the computer system 500, such as a memory 516 and I/O devices 518. Synchronized clocks in the processor 514 and the bus system 506 enable data in the processor 514, the memory 516, and the I/O devices 518 to be transferred and shared across the bus system 506 with minimal data latency or data loss.

Other embodiments and variations are possible. For example, the clock distribution network system 300 can be embedded into a PLL chip to optimize and consolidate the system design. In an alternative embodiment, the network system 300 and the PLL 502 can be designed into an application-specific integrated circuit (ASIC) chip. Further, a PLL, along with a clock distribution network system, can be used in applications other than the computer system described in FIG. 5. For example, they can be used in data communication systems, local area networks, and data storage applications.

All these are intended to be encompassed by the following claims.

What is claimed is:

1. A clock distribution network system comprising:
   a timing source generating a clock and a lock detect signal;
   a plurality of clock buffers;
   a distribution circuit to enable selected buffers of said plurality of clock buffers responsive to appropriate signals including said lock detect signal, said selected buffers driving loads coupled to the buffers; and
   an inhibit circuit to inhibit said appropriate signals in response to said lock detect signal being de-asserted.

2. The system of claim 1, further comprising;
   an enable generator to generate said appropriate signals for passing said clock to selected loads.

3. The system of claim 1, further comprising:
   a clock distribution circuit to route said clock to said plurality of buffers, such that routing of said clock is synchronized with said appropriate signals including said lock detect signal.

4. The system of claim 1, wherein said lock detect signal is de-asserted during a fast frequency acquisition process of the timing source.

5. The system of claim 4, wherein said timing source is a phase-locked loop clock.

6. A method for distributing a clock signal, comprising:
   enabling clock distribution buffers if a lock detect signal indicates that a clock phase is locked; and
   inhibiting clock distribution buffers if the lock detect signal indicates the clock phase is not locked.

7. The method of claim 6, further comprising:
   generating enable signals to perform said clock enable distribution.

8. A computer system comprising:
   a phase-locked loop to provide an accurate clock signal and a lock detect signal;
   a processor having a clock distribution network, said network operating to distribute said phase-locked loop clock signal, said network including:
   a plurality of buffers to receive said clock signal, said buffers having outputs tied to various units in the processor,
   an enabling circuit to enable selected buffers responsive to enable signals and said lock detect signal, said selected buffers driving said various units, and
   a distribution inhibit circuit to inhibit distribution of said clock signal in response to said lock detect signal;
   a memory configured to store data;
   input/output (I/O) devices operating to send and receive data from the processor and the memory; and
   a bus system coupled to said processor, memory, and I/O devices, said bus system configured to enable transfer of data between these devices, said data synchronized with a clock signal distributed by said clock distribution network.

9. The system of claim 8, further comprising;
   an enable generator operating to generate said enable signals for passing said clock signal to selected clock loads.

10. The system of claim 8, further comprising:
   a clock distribution circuit operating to route said clock signal to said buffers synchronized with said enable signals and said lock detect signal.

11. The system of claim 8, wherein said lock detect signal is de-asserted during a fast frequency acquisition process of the phase-locked loop.

\* \* \* \* \*